(12) United States Patent
Ravikumar et al.

(10) Patent No.: US 7,640,475 B2
(45) Date of Patent: Dec. 29, 2009

(54) AT-SPEED TRANSITION FAULT TESTING WITH LOW SPEED SCAN ENABLE

(75) Inventors: Chennagiri P. Ravikumar, Bangalore (IN); Nisar Ahmed, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 493 days.

(21) Appl. No.: 11/410,628

(22) Filed: Apr. 25, 2006

(65) Prior Publication Data
US 2007/0245191 A1    Oct. 18, 2007

(51) Int. Cl.
*G01R 31/28* (2006.01)
*G06F 11/00* (2006.01)

(52) U.S. Cl. .................. 714/731; 714/729; 714/744

(58) Field of Classification Search ............... 714/724, 714/726–731, 744, 798, 799
See application file for complete search history.

(56) References Cited

U.S. PATENT DOCUMENTS

| | | | | |
|---|---|---|---|---|
| 5,889,788 | A * | 3/1999 | Pressly et al. ............... | 714/726 |
| 6,023,778 | A * | 2/2000 | Li ............................... | 714/726 |
| 6,567,943 | B1 * | 5/2003 | Barnhart et al. ............. | 714/727 |
| 6,622,273 | B1 * | 9/2003 | Barnes ........................ | 714/733 |
| 6,671,860 | B2 * | 12/2003 | Langford, II .................. | 716/2 |
| 7,266,742 | B1 * | 9/2007 | Pandey ....................... | 714/726 |
| 7,456,674 | B2 * | 11/2008 | Oakland ...................... | 327/291 |
| 2007/0200597 | A1 * | 8/2007 | Oakland ...................... | 326/46 |
| 2008/0122515 | A1 * | 5/2008 | Oakland ...................... | 327/291 |

OTHER PUBLICATIONS

"Methods for improving transition delay fault coverage using broadside tests" by Devtaprasanna et al. This paper appears in: Test Conference, 2005. Proceedings. ITC 2005. IEEE International Publication Date: Nov. 8-8, 2005 On p. 10 pp. 265 ISBN: 0-7803-9038-5 INSPEC Accession No. 9004537.*

"Novel Bi-partitioned Scan Architecture to Improve Transition Fault Coverage" by Devanathan, V.R. This paper appears in: Test Symposium, 2005. Proceedings. 14th Asian Publication Date: Dec. 18-21, 2005 On pp. 300-305 ISSN: 1081-7735 ISBN: 0-7695-2481-8.*

(Continued)

*Primary Examiner*—Cynthia Britt
(74) *Attorney, Agent, or Firm*—Wade J. Brady, III; Frederick J. Telecky, Jr.

(57) ABSTRACT

A method and/or a system of at-speed transition fault testing with low speed scan enable is disclosed. In one embodiment, a digital system includes any number of scan chains. Each scan chain may have any number of scan cells, an at-speed local scan enable signal to control a mode of operation, and any number of last transition generator cells. In addition, each last transition generator cell includes a first flip-flop with an output connected to a second flip-flop input, an input multiplexer to apply any one of a first flip-flop output data and an OR gate having a first flip-flop input based on a state of the at-speed local scan enable signal, and an OR gate having a first flip-flop output and the global scan enable signal as inputs to generate the at-speed local scan enable signal based on a state of the global scan enable signal.

15 Claims, 6 Drawing Sheets

LAST TRANSITION GENERATOR CELL 100

OTHER PUBLICATIONS

Ahmed, Nisar, et al., "At-Speed Transition Fault Testing Using Low Speed Testers With Application to Reduced Scan Enable Routing Area", *IEEE North Atlantic Test Workshop (NATW'05)*, (2005), 8 pages.

Ahmed, Nisar, et al., "At-Speed Transition Fault Testing With Low Speed Scan Enable", *23rd IEEE VLSI Test Symposium (VTS'05)*, (2005), 7 pages.

* cited by examiner

AT-SPEED TRANSITION FAULT TESTING WITH LOW SPEED SCAN ENABLE

FIELD OF TECHNOLOGY

This disclosure relates generally to the technical fields of electronics and digital circuit technology and, in one example embodiment, to a method and/or a system of at-speed transition fault testing with low speed scan enable.

BACKGROUND

A continuous scaling (e.g., a gate length, an oxide thickness, an other device dimension, etc.) of a transistor (e.g., a MOSFET, a JFET, a HEMT, a BJT, etc.) may allow increasingly more transistors to be packed on an IC chip (e.g., a microprocessor, a memory, a RF transmitter/receiver, etc.) while occupying a smaller area and operating at a higher frequency. An increased complexity in a design, manufacturing, and fabrication process may lead to an aggravated susceptibility to defects (e.g., functional defects, timing-related defects, etc.).

A design for test (DFT) technique is a design method that may include testability hardware features on the IC chip. The design for test technique may be used with an automatic test pattern generator (ATPG) tool (e.g., SYNOPSYS Tetramax ATPG, etc.) to generate an application specific test pattern to locate the defects on the IC chip. The defects may cause the IC chip to malfunction (e.g., fail to meet a design specification, fail to operate, etc.). As a result, an efficiency (e.g., a required time for carrying out the testing, etc.) and an effectiveness (e.g., fault coverage, etc.) of a test method (e.g., stuck-at-fault testing, $I_{DDQ}$ testing, at-speed testing, etc.) are critical metrics that an IC company (e.g., Texas Instruments, Intel, AMD, Motorola, Infineon, IBM, etc.) may use to evaluate the design-for-test technique.

The continuous scaling of the transistor may also cause a number of the timing-related defects to drastically increase. As such, at-speed testing has become imperative for a deep-submicron (DSM) design to ensure operability of the IC chip. At-speed testing may include a path delay model which may target a cumulative delay along a circuit path as well as a transition fault model which may target a delay (e.g., a slow to rise delay and/or a slow to fall delay) at a gate output.

There may be two fault pattern generation methods for the transition fault model that may be used in a scan chain (e.g., a chain of flip-flops, a shift register, etc.); namely, a launch-off-shift (LOS) method and a launch-off-capture (LOC) method. The launch-off-shift method may be a preferred method as a shorter and simpler test pattern may be generated from an automatic test pattern generator (ATPG) due to a combinatorial nature (e.g., no memory elements, and/or no storage elements, etc.). On the other hand, the test pattern generated from the automatic test pattern generator (ATPG) for the launch-off-capture may be longer and more complicated due to a sequential nature (e.g., has memory elements, and/or storage elements, etc.). The shorter and simpler test pattern may allow for higher fault coverage as well as decreased testing time.

Thus, the IC company may benefit significantly from ubiquitous use of the launch-off-shift method for testing the IC chip. However, a major obstacle to prevalent usage of the launch-off-shift method is that a scan enable signal must be able to switch at-speed. This may be difficult to achieve as a fanout load (e.g., a combination of a scan chain, a shift register, an inverter, and/or a flip-flop, etc.) of the scan enable signal may be sizable due to an increasing design size and complexity. While a pipeline scan enabled scheme may be used to divide the fanout load of the scan enable signal, routing awareness is increased and may lead to reduced flexibility with regards to using a place-and-route (PNR) tool. The reduced flexibility when using the place-and-route tool could further complicate the design process when trying to meet a timing closure.

SUMMARY

A method and/or a system of at-speed transition fault testing with low speed scan enable is disclosed. In one aspect, a digital system includes any number of scan chains interconnected together with logic circuitry to form at least a portion of a functional circuit. Each scan chain may have any number of scan cells, a global scan enable signal and an at-speed local scan enable signal to control a mode of operation, any number of last transition generator cells physically located anywhere in the scan chain and not connected to a circuit-under-test, and a clock signal.

In addition, each last transition generator cell may include a first flip-flop with an output connected to a second flip-flop input, an input multiplexer to apply a first flip-flop output data or a test data to a first flip-flop input based on a state of the at-speed local scan enable signal, and an OR gate having a first flip-flop output and the global scan enable signal as inputs to generate the at-speed local scan enable signal based on a state of the global scan enable signal and a state of the first flip-flop output data.

The first flip-flop may be loaded with a state '1' in an initialization cycle and loaded with a state '0' in a launch cycle in a launch-off-shift method. The first flip-flop may be loaded with the state '0' in a launch-off-capture method. The at-speed local scan enable signal to control the launch cycle and a capture cycle may be generated synchronously in the scan chain from the test data based on the clock signal. The at-speed local scan enable signal may be locally generated in the last transition generator cell from any of an at-speed and/or not-at-speed global scan enable signal based on the clock signal.

The global scan enable signal may be asynchronously de-asserted to the state '0' in the initialization cycle and asserted to the state '1' after the capture cycle. A number of local scan enable signals generated may be specified by a user and each local scan enable signal may drive any number of scan cells.

The first flip-flop may remain in the state '0' during and after the capture cycle until it is asynchronously set to the state '1' by the global scan enable signal. The first flip-flop may remain in the state '0' by feeding back the first flip-flop output data to an input '0' of the input multiplexer selected by the local scan enable signal while the first flip-flop output data and the global scan enable signal both remain in the state '0'.

In another aspect, a last transition generator cell to generate an at-speed local scan enable signal from a global scan enable signal includes a first flip-flop with an output connected to a second flip-flop input, an input multiplexer to apply any one of a first flip-flop output data and a test data to a first flip-flop input based on a state of the local scan enable signal. In addition, an OR gate may generate the at-speed local scan enable signal based on a state of the global scan enable signal and a state of the first flip-flop output data, and a clock signal to synchronously control a mode of operation. The first flip-flop may be loaded with a state '1' in an initialization cycle and loaded with a state '0' in a launch cycle in the launch-off-shift method. The first flip-flop may be loaded with the state '0' in the launch-off-capture method.

The at-speed local scan enable signal to control the launch cycle and a capture cycle during transition fault testing may be generated synchronously from the test data based on the clock signal. The global scan enable signal may be asynchronously de-asserted to the state '0' in the initialization cycle and asserted to the state '1' after the capture cycle. The first flip-flop may remain in the state '0' during and after the capture cycle until it is asynchronously set to the state '1' by the global scan enable signal. The first flip-flop may remain in the state '0' by feeding back the first flip-flop output data to the input '0' of the input multiplexer selected by the local scan enable signal while the first flip-flop output data and the global scan enable signal both remain in the state '0'.

In yet another aspect, a method may include generating an at-speed local scan enable signal from a global scan enable signal to control a mode of operation during transition fault testing, decreasing a fanout load of the global scan enable signal, and enhancing flexibility of placing any number of scan cells and any number of last transition generator cells during a place-and-route procedure to meet a timing closure.

In addition, the method may include generating the at-speed local scan enable signal synchronously during a launch cycle and a capture cycle from a test data, and generating the test data by an automatic test pattern generator tool to embed appropriate control information to generate the at-speed local scan enable signal based on a location and a number of last transition generator cells in a scan chain.

In addition, the method may also include setting the global scan enable signal to a state '1' during test setup to overcome a failing during a 'design rule check' phase of the automatic test pattern generator tool due to an internal nature of the at-speed local scan enable signal. The last transition generator cell may be inserted in the scan chain by designing the last transition generator cell as a module and declaring it as a scan segment in a design-for-test compiler.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method and/or a system of at-speed transition fault testing with low speed scan enable is disclosed. In the following description, for the purposes of explanation, numerous specific details are set forth in order to provide a thorough understanding of the various embodiments. It will be evident, however to one skilled in the art that the various embodiments may be practiced without these specific details.

Figure 4:
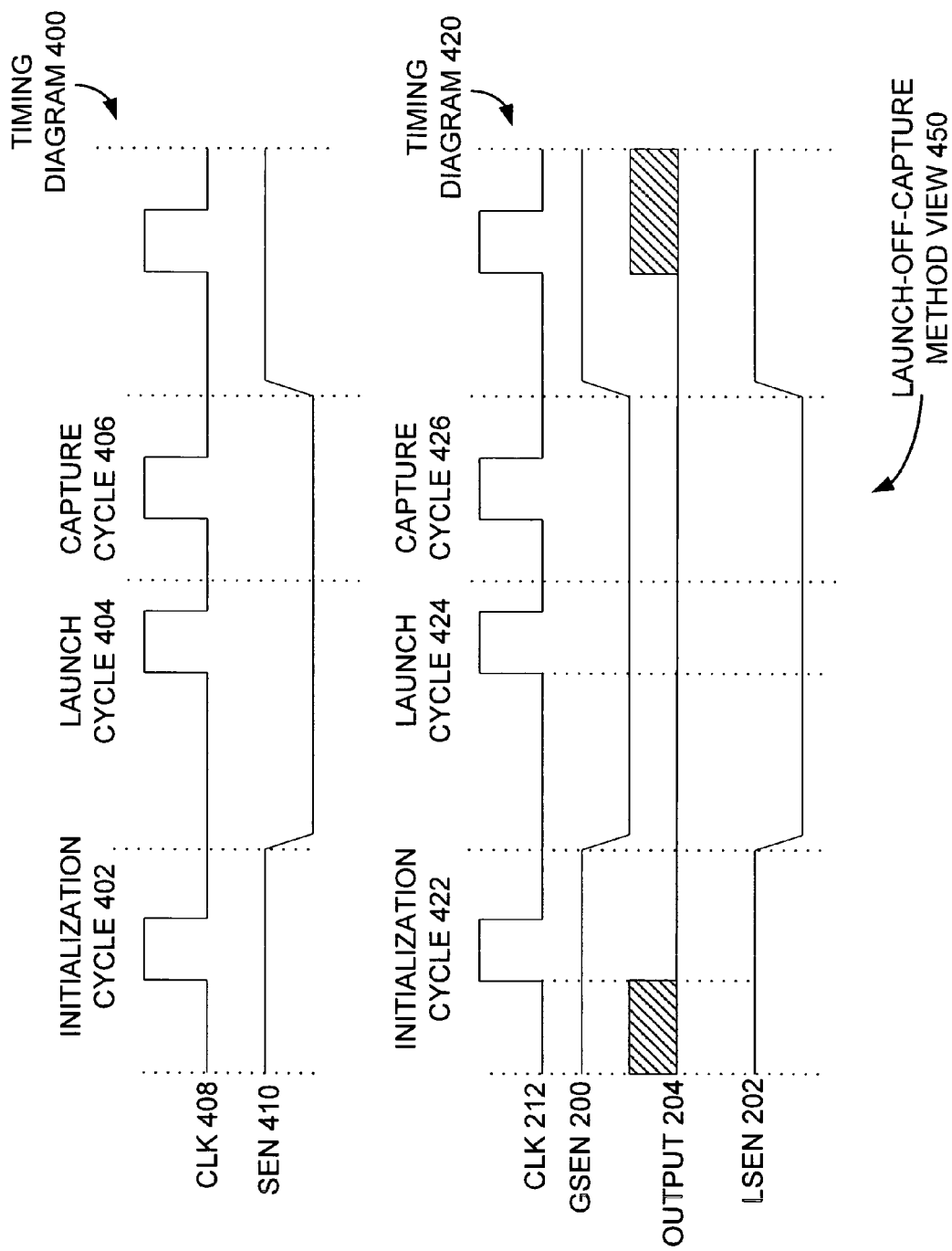
FIG. 4 is a launch-off-capture method view showing a comparison of timing diagrams of a scan enable signal and a local scan enable signal generated by a last transition generator cell, according to one embodiment.
Figure 5:
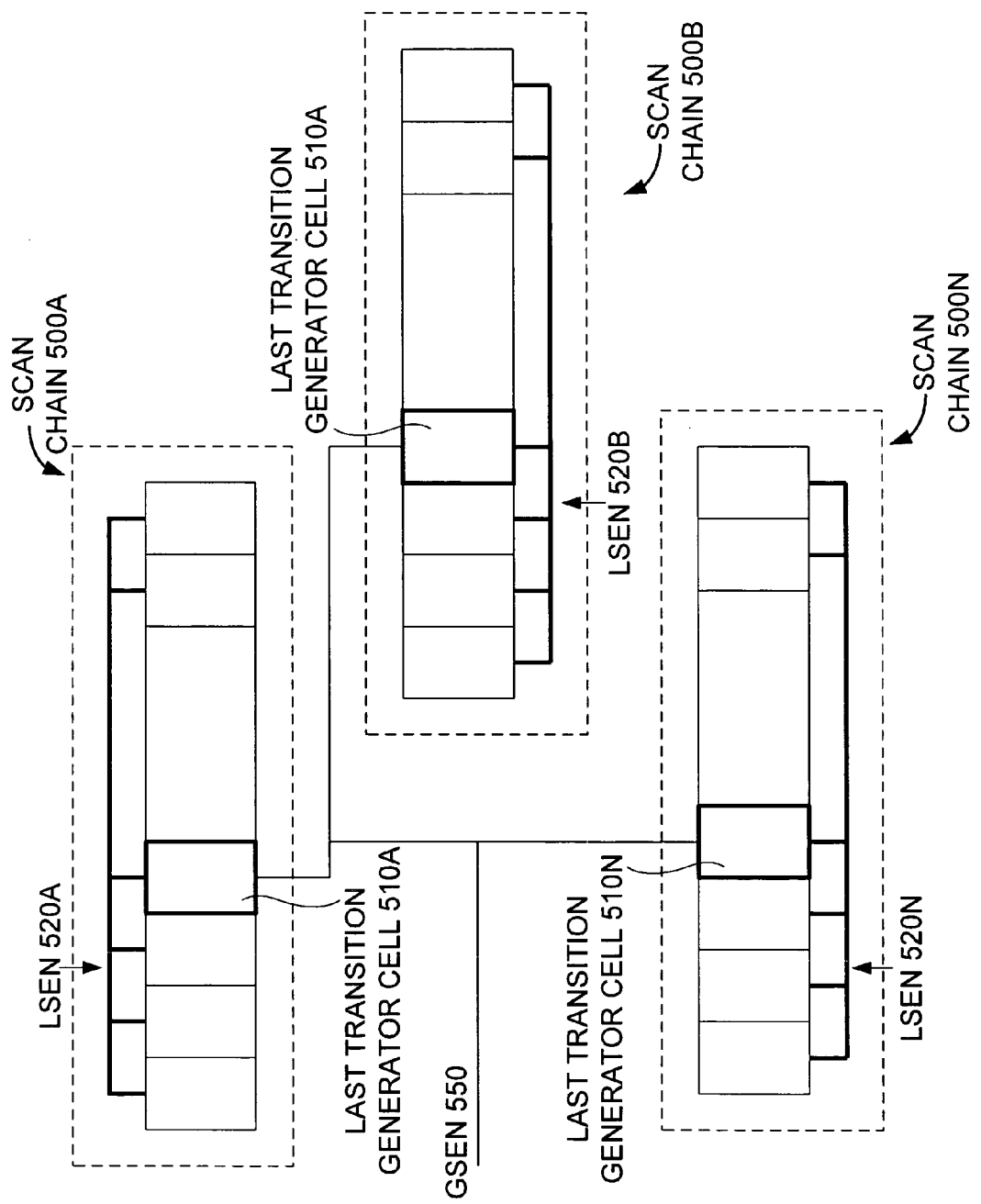
FIG. 5 is a diagram having multiple at-speed local scan enable signals generated from a global scan enable signal applied to multiple scan chains, according to one embodiment.

In one embodiment, a digital system includes any number of scan chains (e.g., as illustrated in FIG. 5) interconnected together with logic circuitry to form at least a portion of a functional circuit. Each scan chain may have any number of scan cells (e.g., as illustrated in FIG. 1), a global scan enable signal (e.g., a GSEN 200 of FIGS. 2-4, a GSEN 550 of FIG. 5) and an at-speed local scan enable signal (e.g., an LSEN 202 of FIGS. 2-4, a LSEN 520A-N of FIG. 5) to control a mode of operation e.g., an initialization cycle 322, 422, a launch cycle 324, 424, a capture cycle 326, 426 of FIGS. 3-4), any number of last transition generator cells physically located anywhere in the scan chain and not connected to a circuit-under-test (as illustrated in FIG. 1 and FIG. 5), and a clock signal (e.g., a CLK 212 of FIGS. 2-4).

In addition, each last transition generator cell may include a first flip-flop (e.g., a D flip-flop 216 of FIG. 2) with an output connected to a second flip-flop (e.g., a D flip-flop 216 of FIG. 2) input, an input multiplexer (e.g., a MUX 220 of FIG. 2) to apply any one of a first flip-flop output data (e.g., an output 204 of FIG. 2) and a test data (e.g., a SD 210 of FIG. 2) to a first flip-flop input based on a state of the at-speed local scan enable signal (e.g., the LSEN 202 of FIG. 2), and an OR gate (e.g., an OR gate 218 of FIG. 2) having a first flip-flop output and the global scan enable signal (e.g., the GSEN 200 of FIG. 2) as inputs to generate the at-speed local scan enable signal based on a state of the global scan enable signal and a state of the first flip-flop output data. In another embodiment, a last transition generator cell (e.g., a last transition generator cell 100 of FIG. 2) to generate an at-speed local scan enable signal (e.g., a LSEN 202) from a global scan enable signal (e.g., the GSEN 200) includes a first flip-flop (e.g., a D flip-flop 216) with an output (e.g., an output 206) connected to a second flip-flop (e.g., a D flip-flop 216) input, an input multiplexer (e.g., a MUX 220) to apply an one of a first flip-flop output data (e.g., the output 206) and a test data (e.g., a SD 210) to a first flip-flop input based on a state of the local scan enable signal. In addition, an OR gate may generate the at-speed local scan enable signal based on a state of the global scan enable signal and a state (e.g., a state '0', a state '1') of the first flip-flop output data, and a clock signal (e.g., the CLK 212 of FIG. 2) to synchronously control a mode of operation (e.g., an initialization cycle 322, 422, a launch cycle 324, 424, a capture cycle 326, 426 of FIGS. 3-4).

In yet another embodiment, a method may include generating an at-speed local scan enable signal (e.g., the LSEN 202 of FIG. 1, the LSEN 520A-C of FIG. 5) from a global scan enable signal to control a mode of operation during transition fault testing, decreasing a fanout load (e.g., as illustrated in FIG. 5) of the global scan enable signal (e.g., the GSEN 200 of FIG. 2, the GSEN 500 of FIG. 5), and enhancing flexibility of placing any number of scan cells and any number of last transition generator cells during a place-and-route procedure to meet a timing closure.

Figure 1:
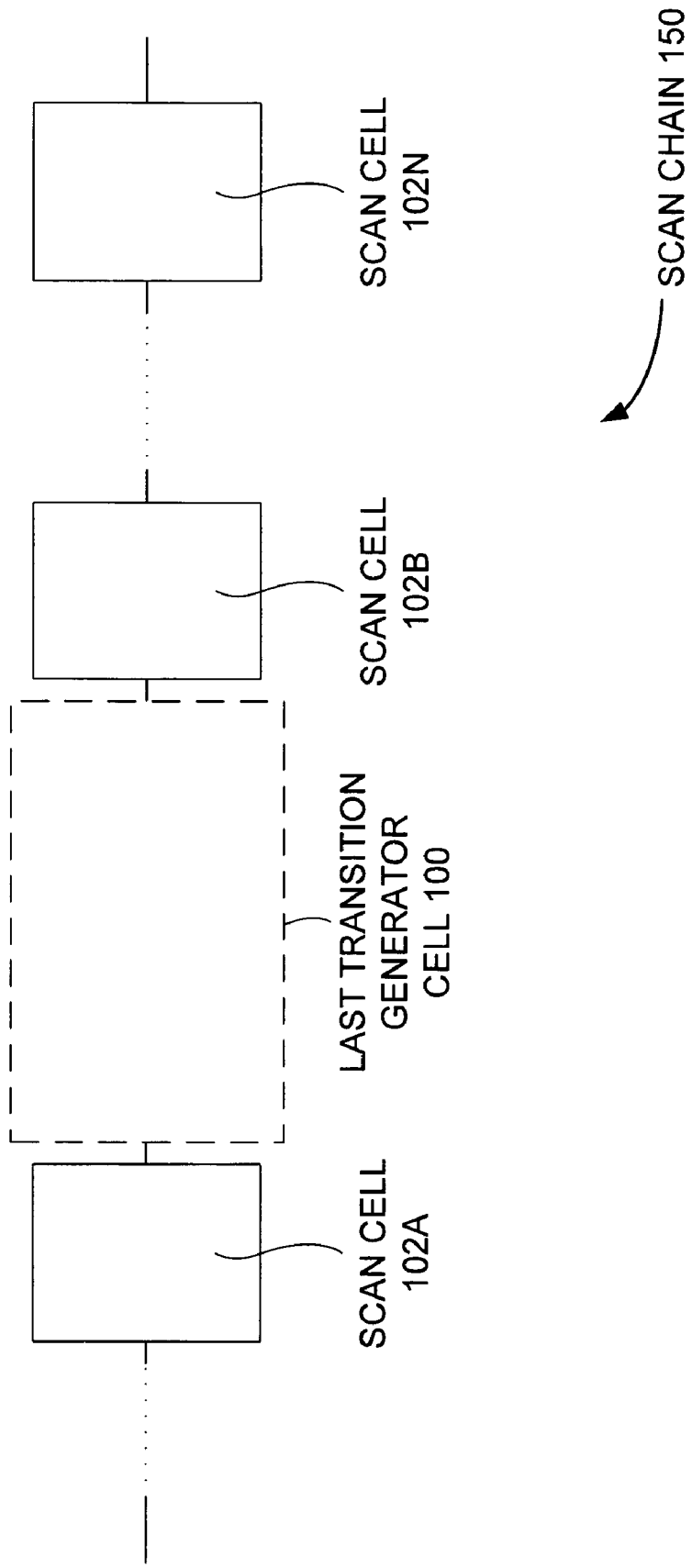
FIG. 1 is a diagram of a scan chain having a last transition generator cell and multiple scan cells, according to one embodiment.

FIG. 1 is a diagram of a scan chain 150 having a last transition generator cell 100 and multiple scan cells (e.g., a scan cell 102A, a scan cell 102B, and/or a scan cell 102N, etc.) according to one embodiment.

A scan chain (e.g., the scan chain 150) may perform a transition fault test (e.g., a launch-off-shift test, a launch-off-capture test, etc.) to detect a timing-related defect (e.g., a cumulative path delay, a slow-to-rise delay, a slow-to-fall delay, etc.). The scan chain (e.g., the scan chain 150) may include any number of scan cells (e.g., a scan cell 100A, 100B, and/or 100N, etc.) and any number of last transition generator cells (e.g., the last transition generator cell 100). The scan chain and the last transition generator cell may not be connected to a circuit-under-test. During the transition fault test (e.g., the launch-off-shift test, the launch-off-capture test, etc.), a mode of operation (e.g., an initialization cycle, a launch cycle and/or a capture cycle, etc.) may be based on a state (e.g., a state '0', a state '1') of a scan enable signal (e.g., an at-speed local scan enable signal, and/or a global scan-enable signal). The at-speed local scan enable signal to control the mode of operation (e.g., the initialization cycle, the launch cycle, and/or the capture cycle, etc.) may be generated locally (e.g., in the scan chain (e.g., the scan chain 150)) by an internal circuit component (e.g., the last transition generator cell 100).

Figure 2:
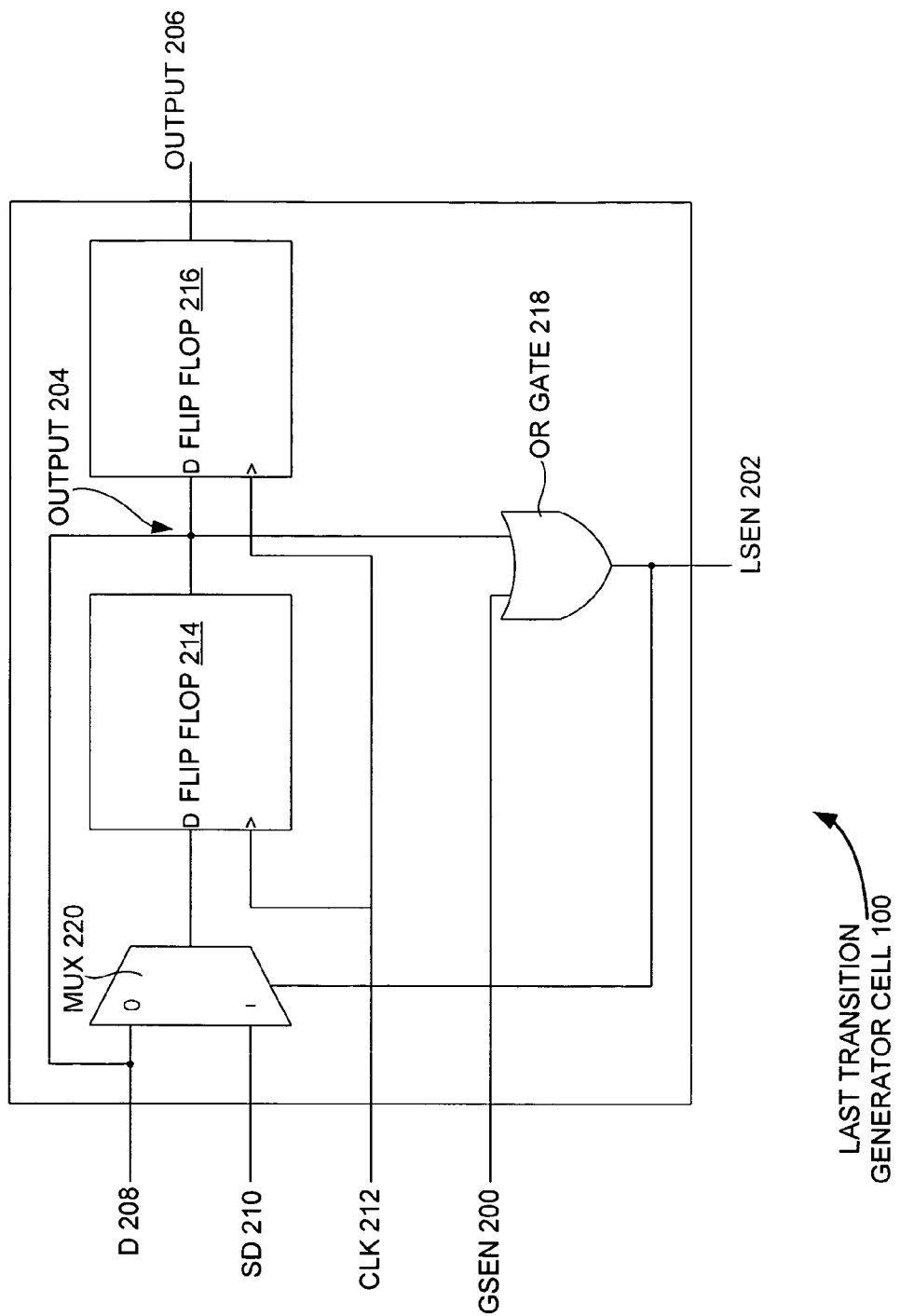
FIG. 2 is a circuit diagram of a last transition generator cell, according to one embodiment.

FIG. 2 is a circuit diagram of a last transition generator cell 100 of FIG. 1, according to one embodiment.

FIG. 2 illustrates an exploded view of the last transition generator cell 100 of FIG. 1. The last transition generator cell 100 may have two input signals (e.g., a D 208 and/or an SD 210). The D 208 may be connected to an input '0' of an input multiplexer (e.g., a MUX 220) and the SD 210 may be connected to an input '1' of the input multiplexer (e.g., the MUX 220). An input multiplexer (e.g., the MUX 220) output may be coupled to a first flip-flop (e.g., a D flip-flop 214). The first flip-flop output data (e.g., an output 204) may be coupled to a second flip-flop (e.g., a D flip-flop 216). A second flip-flop output (e.g., an output 206) may be an output of the last transition generator cell 100. A global scan enable signal (e.g., the GSEN 200) and the first flip-flop output data (e.g., the output 204) may be inputs to an OR gate (e.g., the OR gate 218) whose output may be an at-speed local scan enable signal (e.g., a LSEN 202).

In FIG. 2, the last transition generator cell 100 may store two bits by including the first flip-flop (e.g., the D flip-flop 214) with the first flip-flop output data (e.g. the output 204) synchronously coupled to the second flip-flop (e.g., the D flip-flop 216) input by a clock signal (e.g., a CLK 212). The input multiplexer (e.g., a MUX 220) may be used to apply the first flip-flop output data (e.g., the output 204) or a test data (e.g., the SD 210) to the first flip-flop (e.g., the D flip-flop 216) input based on a state of a select signal (e.g., the LSEN 202). The select signal (e.g., the LSEN 202) may be based on a state of the OR gate (e.g., the OR gate 218) output signal having the first flip-flop output data (e.g., the output 204) and a global scan enable signal (e.g., a GSEN 200) as inputs.

In one embodiment, the first flip-flop (e.g., the D flip-flop 216) may be loaded with a state '1' in an initialization cycle and loaded with a state '0' in a launch cycle to generate the at-speed local scan enable signal (e.g., the LSEN 202) from the global scan enable signal (e.g., the GSEN 200) for an at-speed transition between the launch cycle and a capture cycle in a launch-off-shift test. In a launch-off-capture test, the first flip-flop (e.g., the D flip-flop 216) may be loaded with the state '0' to ensure the at-speed local scan enable signal (e.g., the LSEN 202) is de-asserted to the state '0' when the global scan enable signal (e.g., the GSEN 200) is de-asserted to the state '0' after a shift cycle.

In another embodiment, the at-speed local scan enable signal (e.g., the LSEN 202) to control a mode of operation (e.g., an initialization cycle, a launch cycle, and/or a capture cycle, etc.) may be generated synchronously from the test data (e.g., the SD 210) and the global scan enable signal (e.g., the GSEN 200) based on the clock signal (e.g., the clock 212).

In yet another embodiment, the at-speed local scan enable signal (e.g., the LSEN 202) may remain in the state '0' during and after the capture cycle until it is asynchronously set to the state '1' by the global scan enable signal (e.g., the GSEN 200) to ensure proper operation of the transition fault test. Since the at-speed local scan enable signal (e.g., the LSEN 202) is based on the state of the two-input OR gate (e.g., the OR gate 218) output signal having the first flip-flop output data (e.g., the output 204) and the global scan enable signal (e.g., a GSEN 200) as inputs, the first flip-flop output data (e.g., the output 204) may be kept at the state '0' for the at-speed local scan enable signal (e.g., the LSEN 202) to remain at the state '0' when the global scan enable signal (e.g., the GSEN 200) is at the state '0'.

As such, the first flip-flop output data (e.g., the output 204) is fed back to the input '0' of the input multiplexer (e.g., the MUX 220). The input '0' of the input multiplexer may be selected by the selection line (e.g., the LSEN 202) as long as the first flip-flop output data (e.g., the output 204) and the global scan enable signal (e.g., the GSEN 200) both remain in the state '0'.

Figure 3:
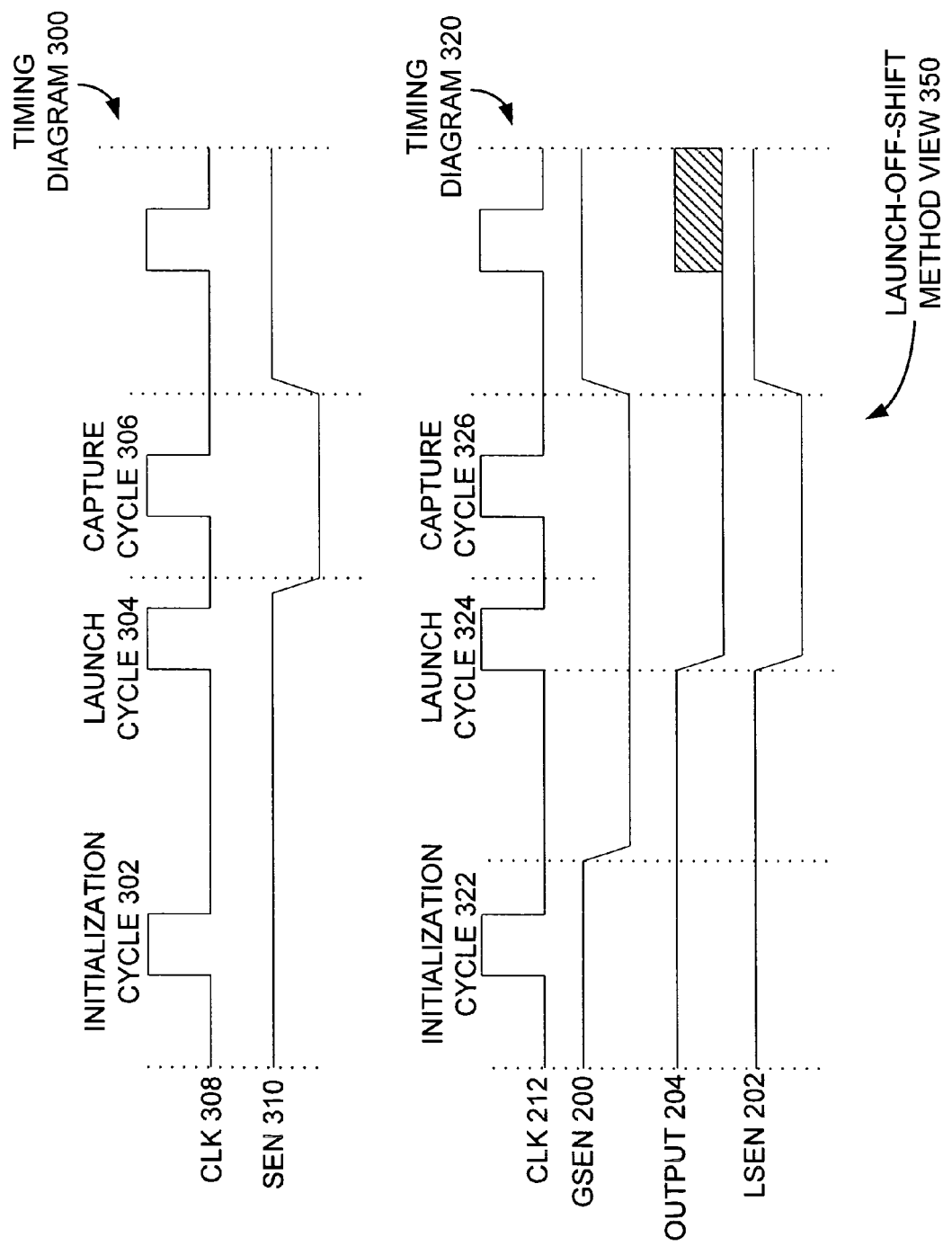
FIG. 3 is a launch-off-shift method view showing a comparison of timing diagrams of a scan enable signal and a local scan enable signal generated by a last transition generator cell, according to one embodiment.

FIG. 3 is a launch-off-shift method view 350 showing a comparison of timing diagrams 300 and 320 for a scan enable signal 310 and a local scan enable signal 202 generated by a last transition generator cell, according to one embodiment.

The timing diagram 300 shows a state (e.g., a state '1', a state '0') of a scan enable signal (e.g., a SEN 310) with respect to a clock signal (e.g., a CLK 308) corresponding to a mode of operation (e.g., an initialization cycle 302, a launch cycle 304, and/or a capture cycle 306, etc.) such that proper operation may be ensured in the launch-off-shift method. The scan enable signal (e.g., the SEN 310) may transition at-speed after the launch cycle 304 and before the capture cycle 306.

The timing diagram 320 shows a state (e.g., the state '1', the state '0') of an at-speed local scan enable signal (e.g., a LSEN 202) with respect to a clock signal (e.g., a CLK 212) generated from an logic OR of a global scan enable signal (e.g., a GSEN 200) and a first flip-flop output data (e.g., an output 204) corresponding to a mode of operation (e.g., an initialization cycle 322, a launch cycle 324, and/or a capture cycle 326, etc.). In one embodiment, the global scan enable signal (e.g., the GSEN 200) may be asynchronously de-asserted to the state '0' in an initialization cycle (e.g., the initialization cycle 322) and asserted to the state '1' after a capture cycle (e.g., the capture cycle 326). The de-assertion to the state '0' in the initialization cycle and the assertion to the state '1' of the global scan enable signal (e.g., the GSEN 200) after the capture cycle may not be at-speed.

By loading the state '1' in the first flip-flop (e.g., the D flip-flop 216) in the initialization cycle (e.g., the initialization cycle 322) and loading the state '0' in the first flip-flop (e.g., the flip-flop 214) in a launch cycle (e.g., the launch cycle 324), an at-speed transition from the state '1' to the state '0' may be generated in the at-speed local scan enable signal (e.g., the LSEN 202). After a de-assertion of the at-speed local scan enable signal (e.g., the LSEN 202), a state of the first flip-flop output may be maintained at the state '0' while the global scan enable signal (e.g., the GSEN 200) is at the state '0'. The at-speed local scan enable signal (e.g., the LSEN 202) thus generated may be applied to a scan chain (e.g., the scan chain 150 of FIG. 1, the scan chains 500A-N of FIG. 5) such that proper operation may be ensured in the launch-off-shift method.

FIG. 4 is a launch-off-capture method view showing a comparison of timing diagrams 400 and 420 for a scan enable signal 410 and a local scan enable signal 202 generated by a last transition generator cell, according to one embodiment.

The timing diagram 400 shows a state (e.g., a state '1', a state '0') of a scan enable signal (e.g., a SEN 410) with respect to a clock signal (e.g., a CLK 408) corresponding to a mode of operation (e.g., an initialization cycle 402, a launch cycle 404, and/or a capture cycle 406, etc.) such that proper operation may be ensured in the launch-off-capture method. The scan enable signal (e.g., the SEN 410) may be de-asserted after the initialization cycle 402 and asserted after the capture cycle 406. The de-assertion after the initialization cycle 402 and assertion after the capture cycle 406 of the scan enable signal (e.g., the SEN 410) may not be at-speed.

The timing diagram 420 shows a state (e.g., the state '1', the state '0') of an at-speed local scan enable signal (e.g., a LSEN 202) with respect to a clock signal (e.g., a CLK 212) generated from a logic OR of a global scan enable signal (e.g., a GSEN 200) and a first flip-flop output data (e.g., an output 204) corresponding to a mode of operation (e.g., an initialization cycle 422, a launch cycle 424, and/or a capture cycle 426, etc.). In one embodiment, the global scan enable signal (e.g., the GSEN 200) may be asynchronously de-asserted to the state '0' in an initialization cycle (e.g., the initialization cycle 422) and asserted to the state '1' after a capture cycle (e.g., the capture cycle 426). The de-assertion to the state '0' in the initialization cycle and the assertion to the state '1' of the global scan enable signal (e.g., the GSEN 200) after the capture cycle may not be at-speed.

By loading the state '0' in the first flip-flop (e.g., the D flip-flop 216) the local scan enable signal (e.g., the LSEN 202) may be de-asserted to the state '0' when the global scan enable signal (e.g., the GSEN 200) is in the state '0'. After a de-assertion of the local scan enable signal (e.g., the LSEN 202), a state of the first flip-flop output may be maintained at the state '0' while the global scan enable signal (e.g., the GSEN 200) is at the state '0'. The local scan enable signal (e.g., the LSEN 202) thus generated may be applied to a scan chain (e.g., the scan chain 150 of FIG. 1, the scan chains 500A-N of FIG. 5) such that proper operation may be ensured in the launch-off-capture method. Note that the local scan enable signal (e.g. the LSEN 202) thus generated for the launch-off-capture method may not be at-speed.

FIG. 5 is a diagram having multiple at-speed local scan enable signals (e.g., LSEN 520A-N) generated from a global scan enable signal (e.g., a GSEN 550) applied to multiple scan chains, according to one embodiment.

In FIG. 5, multiple scan chains (e.g., scan chains 500A-N) may be interconnected together with logic circuitry to form at least a portion of a functional circuit. Any number of at-speed local scan enable signals (e.g., the LSEN 520A-N) may be generated from the global scan enable signal (e.g., the GSEN 550) to control a mode of operation (e.g., an initialization cycle 322, 422, a launch cycle 324, 424, a capture cycle 326, 426 of FIGS. 3-4) during transition fault testing (e.g., a launch-off-shift test, a launch-off-capture test, etc.). Therefore, any number of scan chains (e.g., scan chains 500A-N) may be driven by the at-speed local scan enable signals (e.g., the LSEN 520A-N). As such, a fanout load (e.g., a combination of a scan chain, a shift register, an inverter, and/or a flip-flop, etc.) of the global scan enable signal (e.g., the GSEN 550) may be decreased to a number of last transition generator cells (e.g., a last transition generator cell 100 of FIG. 1, the last transition generator cells 510A-N) from a number of scan cells (e.g., a scan cell 102A, a scan cell 102B, and/or a scan cell 102N of FIG. 1), according to one embodiment.

In another embodiment, the number of last transition generator cells (e.g., the last transition generator cell 100 of FIG. 1, the last transition generator cells 510A-N) may be specified by a user and each at-speed local scan enable signal (e.g., the LSEN 202 of FIG. 2, the LSEN 520A-N) may drive any number of the scan cell (e.g., a scan cell 102A, a scan cell 102B, and/or a scan cell 102N of FIG. 1). The last transition generator cell (e.g., the last transition generator cell 100 of FIG. 1, the last transition generator cells 510A-N) may also be placed anywhere in the scan chain (e.g., a scan chain 150 of FIG. 1, the scan chains 500A-N). As a result, flexibility may be enhanced during a place-and-route procedure to meet a timing closure.

Figure 6:
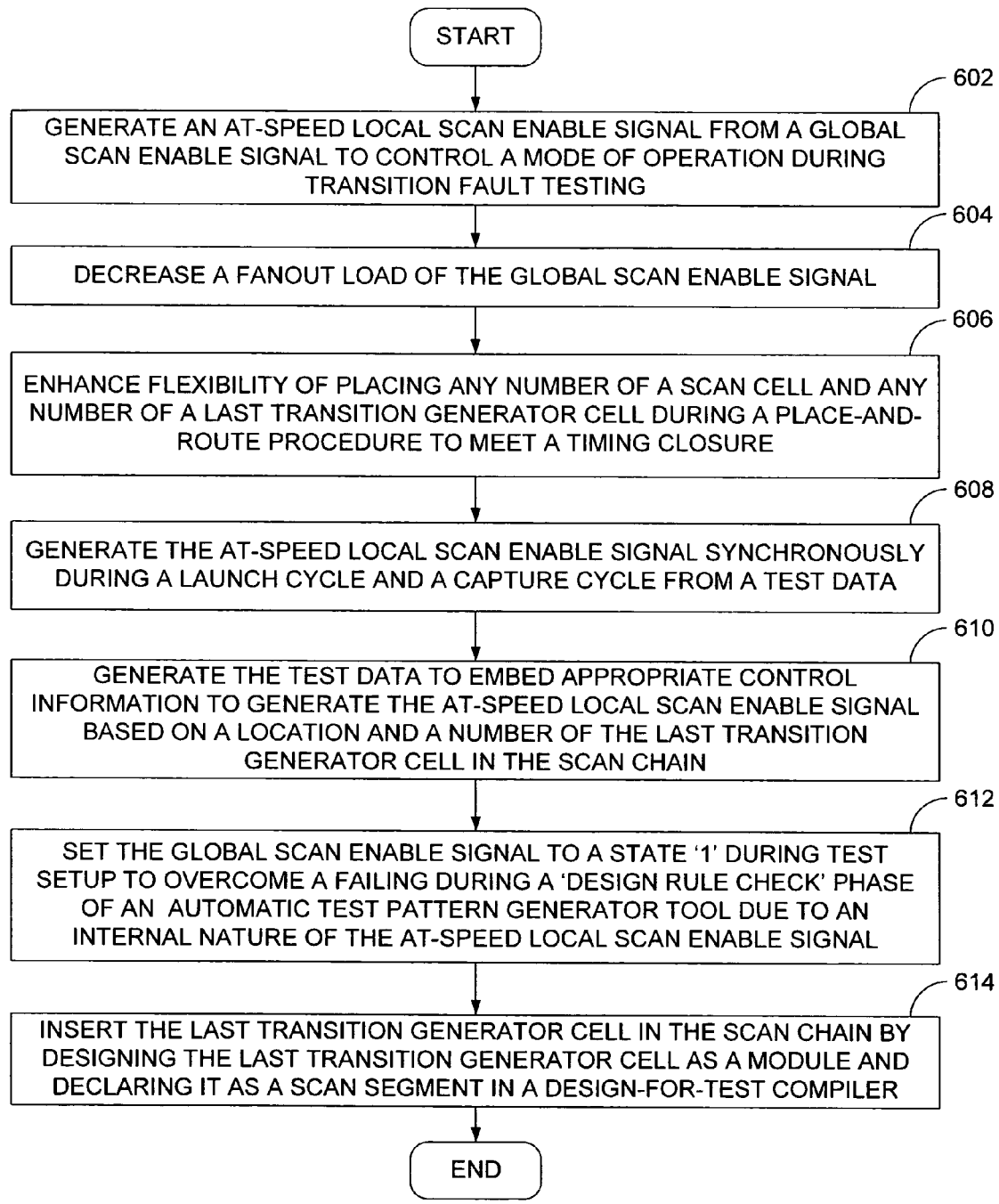
FIG. 6 is a process flow of generating an at-speed local scan enable signal from a global scan enable signal, according to one embodiment.

FIG. 6 is a process flow of generating an at-speed local scan enable signal from a global scan enable signal, according to one embodiment. In operation 602, an at-speed local scan enable signal (e.g., the at-speed local scan enable signal 202 of FIG. 1, the local scan enable signals 520A-N of FIG. 5) is generated to control a mode of operation (e.g., an initialization cycle 322, 422, a launch cycle 324, 424, a capture cycle 326, 426 of FIGS. 3-4) during transition fault testing (e.g., a launch-off-shift test, a launch-off-capture test, etc.). In operation 604, a fanout load (e.g., a combination of a scan chain, a shift register, an inverter, and/or a flip-flop, etc.) of the global scan enable signal (e.g., the GSEN 200 of FIG. 2, the GSEN 500 of FIG. 5) is decreased.

In operation 606, flexibility of placing any number of scan cells (e.g., a scan cell 102A, a scan cell 102B, and/or a scan cell 102N of FIG. 1) and any number of last transition generator cells (e.g., the last transition generator cell 100 of FIG. 1, the last transition generator cells 510A-N of FIG. 5) is enhanced during a place-and-route procedure to meet a timing closure.

Then, in operation 608, the at-speed local scan enable signal (e.g., the at-speed local scan enable signal 202 of FIG. 1, the local scan enable signals 520A-N of FIG. 5) may be generated synchronously during a launch cycle and a capture cycle from the test data (e.g., the SD 210). In operation 610, the test data (e.g., the SD 210) to generate the at-speed local scan enable signal (e.g., the at-speed local scan enable signal 202 of FIG. 1, the local scan enable signals 520A-N of FIG. 5) may be generated to embed appropriate control information based on a location and a number of the last transition generator cell (e.g., the last transition generator cell 100 of FIG. 1, the last transition generator cells 510A-N of FIG. 5) in a scan chain (e.g., the scan chain 150 of FIG. 1, the scan chains 500A-N of FIG. 5).

Then, in operation 612, the global scan enable signal (e.g., the GSEN 200 of FIG. 2, the GSEN 500 of FIG. 5) may be set to a state '1' during test setup to overcome a failing during a 'design rule check' phase of an automatic test pattern generator tool (e.g., SYNOPSYS Tetramax ATPG, etc.) due to an internal nature of the at-speed local scan enable signal (e.g., the at-speed local scan enable signal 202 of FIG. 1, the local scan enable signals 520A-N of FIG. 5). In operation 614, the last transition generator cell may be inserted in the scan chain (e.g., the scan chain 150 of FIG. 1, the scan chains 500A-N of FIG. 5) by designing the last transition generator cell (e.g., the last transition generator cell 100 of FIG. 1, the last transition generator cells 510A-N of FIG. 5) as a module and declaring it as a scan segment in a design for test compiler (e.g., SYNOPSYS DFTCompiler, etc.).

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A digital system, comprising:
a plurality of scan chains interconnected together with logic circuitry to form at least a portion of a functional circuit, with each scan chain having any number of scan cells, a global scan enable signal and an at-speed local scan enable signal to control a mode of operation, any number of last transition generator cells physically located anywhere in the scan chain and not connected to a circuit-under-test, a clock signal, with each last transition generator cell having:
a first flip-flop with an output connected to a second flip-flop input;
an input multiplexer to apply any one of a first flip-flop output data and a test data to a first flip-flop input based on a state of the at-speed local scan enable signal; and
an OR gate having a first flip-flop output and the global scan enable signal as inputs to generate the at-speed local scan enable signal based on a state of the global scan enable signal and a state of the first flip-flop output data.

2. The digital system of claim 1 wherein the first flip-flop is loaded with a state '1' in an initialization cycle and loaded with a state '0' in a launch cycle in a launch-off-shift method.

3. The digital system of claim 2 wherein the first flip-flop remains in the state '0' during and after the capture cycle until it is asynchronously set to the state '1' by the global scan enable signal.

4. The digital system of claim 3 wherein the first flip-flop remains in the state '0' by feeding back the first flip-flop output data to an input '0' of the input multiplexer selected by the at-speed local scan enable signal while the first flip-flop output data and the global scan enable signal both remain in the state '0'.

5. The digital system of claim 1 wherein the first flip-flop is loaded with the state '0' a launch-off-capture method.

6. The digital system of claim 1 wherein the at-speed local scan enable signal to control the mode of operation is generated synchronously in the scan chain from the test data based on the clock signal.

7. The digital system of claim 6 wherein the at-speed local scan enable signal is locally generated in the last transition generator cell from any of an at-speed and not-at-speed global scan enable signal based on the clock signal.

8. The digital system of claim 6 wherein the global scan enable signal is asynchronously de-asserted to the state '0' in the initialization cycle and asserted to the state '1' after the capture cycle.

9. A last transition generator cell to generate an at-speed local scan enable signal from a global scan enable signal, comprising:
a first flip-flop with an output connected to a second flip-flop input;
an input multiplexer to apply any one of a first flip-flop output data and a test data to a first flip-flop input based on a state of the at-speed local scan enable signal;
an OR gate to generate the at-speed local scan enable signal based on a state of the global scan enable signal and a state of the first flip-flop output data; and
a clock signal to synchronously control a mode of operation.

10. The last transition generator cell of claim 9 wherein the first flip-flop is loaded with a state '1' in an initialization cycle and loaded with a state '0' in a launch cycle in the launch-off-shift method.

11. The last transition generator cell of claim 10 wherein the global scan enable signal is asynchronously de-asserted to the state '0' in the initialization cycle and asserted to the state '1' after the capture cycle.

12. The last transition generator cell of claim 9 wherein the first flip-flop is loaded with the state '0' in the launch-off-capture method.

13. The last transition generator cell of claim 9 wherein the at-speed local scan enable signal to control the mode of operation during transition fault testing is generated synchronously from the test data based on the clock signal.

14. The last transition generator cell of claim 9 wherein the first flip-flop remains in the state '0' during and after the capture cycle until it is asynchronously set to the state '1' by the global scan enable signal.

15. The last transition generator cell of claim 14 wherein the first flip-flop remains in the state '0' by feeding back the first flip-flop output data to an input '0' of the input multiplexer selected by the at-speed local scan enable signal while the first flip-flop output data and the global scan enable signal both remain in the state '0'.

* * * * *

UNITED STATES PATENT AND TRADEMARK OFFICE
CERTIFICATE OF CORRECTION

PATENT NO. : 7,640,475 B2
APPLICATION NO. : 11/410628
DATED : December 29, 2009
INVENTOR(S) : Ravikumar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 741 days.

Signed and Sealed this

Twenty-first Day of December, 2010

David J. Kappos
*Director of the United States Patent and Trademark Office*